(12) United States Patent
Bhalla et al.

(10) Patent No.: US 9,450,083 B2
(45) Date of Patent: *Sep. 20, 2016

(54) HIGH VOLTAGE FIELD BALANCE METAL OXIDE FIELD EFFECT TRANSISTOR (FBM)

(71) Applicant: Alpha and Omega Semiconductor Incorporated, Sunnyvale, CA (US)

(72) Inventors: Anup Bhalla, Santa Clara, CA (US); Hamza Yilmaz, Saratoga, CA (US); Madhur Bobde, San Jose, CA (US); Lingpeng Guan, Sunnyvale, CA (US); Jun Hu, San Bruno, CA (US); Jongoh Kim, Suwon (KR); Yongping Ding, Sunnyvale, CA (US)

(73) Assignee: ALPHA AND OMEGA SEMICONDUCTOR INCORPORATED, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/841,491

(22) Filed: Aug. 31, 2015

(65) Prior Publication Data

US 2015/0372129 A1 Dec. 24, 2015

Related U.S. Application Data

(60) Continuation of application No. 14/329,776, filed on Jul. 11, 2014, now Pat. No. 9,129,822, which is a division of application No. 13/561,523, filed on Jul. 30, 2012, now Pat. No. 8,785,279.

(51) Int. Cl.
*H01L 29/66* (2006.01)
*H01L 29/78* (2006.01)
(Continued)

(52) U.S. Cl.
CPC ....... *H01L 29/7811* (2013.01); *H01L 29/0615* (2013.01); *H01L 29/0623* (2013.01);
(Continued)

(58) Field of Classification Search
CPC .................................................. H01L 29/66621
USPC .................................................. 257/331, 491
See application file for complete search history.

(56) References Cited

U.S. PATENT DOCUMENTS 3,391,287 A 7/1968 Kao et al.
4,158,206 A 6/1979 Neilson
(Continued)

FOREIGN PATENT DOCUMENTS

CN 202839620 U 3/2013
TW 201130114 A 9/2011

OTHER PUBLICATIONS

Baliga, B.J. Advanced Power MOSFET Concepts. New York: Springer-Science, 2010. 23-61. Print.
(Continued)

*Primary Examiner* — Chandra Chaudhari
(74) *Attorney, Agent, or Firm* — Joshua D. Isenberg; JDI Patent

(57) ABSTRACT

A semiconductor device includes a semiconductor substrate of a first conductivity type. A first conductivity type epitaxial layer disposed on a top surface of the substrate includes a surface shielded region above a less heavily doped voltage blocking region. A body region of a second conductivity type opposite the first conductivity type is disposed near a top surface of the surface shielded region. A first conductivity type source region is disposed near the top surface inside the body region. A drain is disposed at a bottom surface of the substrate. A gate overlaps portions of the source and body regions. Gate insulation separates the gate from the source and body regions. First and second trenches formed in the surface shielded region are lined with trench insulation material and filled with electrically conductive trench filling material. Second conductivity type buried doped regions are positioned below the first and second trenches, respectively.

21 Claims, 18 Drawing Sheets

(51) Int. Cl.
*H01L 29/06* (2006.01)
*H01L 29/08* (2006.01)
*H01L 29/10* (2006.01)
*H01L 29/40* (2006.01)
*H01L 21/265* (2006.01)

(52) U.S. Cl.
CPC ....... *H01L29/0634* (2013.01); *H01L 29/0878* (2013.01); *H01L 29/1095* (2013.01); *H01L 29/404* (2013.01); *H01L 29/407* (2013.01); *H01L 29/66712* (2013.01); *H01L 29/7802* (2013.01); *H01L 29/7813* (2013.01); *H01L 21/26586* (2013.01); *H01L 2924/0002* (2013.01)

(56) References Cited

U.S. PATENT DOCUMENTS

| | | |
|---|---|---|
| 4,573,066 A | 2/1986 | Whight |
| 4,648,174 A | 3/1987 | Temple et al. |
| 4,941,026 A | 7/1990 | Temple |
| 5,637,898 A | 6/1997 | Baliga |
| 5,973,360 A | 10/1999 | Tihanyi |
| 5,998,833 A | 12/1999 | Baliga |
| 6,252,288 B1 | 6/2001 | Chang |
| 6,452,230 B1 | 9/2002 | Boden, Jr. |
| 6,512,268 B1 | 1/2003 | Ueno |
| 6,545,316 B1 | 4/2003 | Baliga |
| 6,762,455 B2 | 7/2004 | Oppermann et al. |
| 6,803,626 B2 | 10/2004 | Sapp et al. |
| 7,087,958 B2 * | 8/2006 | Chuang ................ H01L 29/402 257/328 |
| 7,291,894 B2 | 11/2007 | Sapp et al. |
| 7,335,944 B2 | 2/2008 | Banerjee et al. |
| 7,335,949 B2 | 2/2008 | Ninomiya et al. |
| 7,393,749 B2 | 7/2008 | Yilmaz et al. |
| 7,649,223 B2 | 1/2010 | Kawashima |
| 8,076,718 B2 * | 12/2011 | Takaya ................ H01L 29/0623 257/330 |
| 8,575,685 B2 | 11/2013 | Bobde et al. |
| 8,680,613 B2 | 3/2014 | Guan et al. |
| 9,129,822 B2 * | 9/2015 | Bhalla ................ H01L 29/0634 |
| 9,224,852 B2 | 12/2015 | Guan et al. |
| 2005/0098826 A1 | 5/2005 | Yamaguchi et al. |
| 2005/0230744 A1 | 10/2005 | Wu |
| 2007/0001194 A1 | 1/2007 | Ono et al. |
| 2007/0001230 A1 | 1/2007 | Lee et al. |
| 2007/0181927 A1 | 8/2007 | Yedinak et al. |
| 2011/0076815 A1 | 3/2011 | Bhalla et al. |
| 2011/0204442 A1 | 8/2011 | Guan et al. |
| 2011/0220998 A1 | 9/2011 | Darwish et al. |
| 2011/0278650 A1 | 11/2011 | Tamaki et al. |
| 2012/0161274 A1 | 6/2012 | Lee et al. |
| 2013/0049102 A1 | 2/2013 | Bobde et al. |
| 2013/0075809 A1 | 3/2013 | Hsieh |
| 2013/0092976 A1 | 4/2013 | Hsieh |
| 2014/0027819 A1 | 1/2014 | Guan et al. |
| 2014/0027840 A1 | 1/2014 | Guan et al. |
| 2014/0027841 A1 | 1/2014 | Bhalla et al. |
| 2014/0193958 A1 | 7/2014 | Guan et al. |

OTHER PUBLICATIONS

Final Office Action for U.S. Appl. No. 13/561,500, dated Jun. 3, 2015.
Non-Final Office Action for U.S. Appl. No. 13/561,500, dated Oct. 21, 2014.
Non-Final Office Action for U.S. Appl. No. 13/561,500, dated Feb. 11, 2015.
Taiwanese Action for TW Application No. 10420360220, dated Mar. 23, 2015.
Onishi, Y.; Iwamoto, S.; Sato, T.; Nagaoka, T.; Ueno, K.; Fujihira, T., "24 mΩcm2 680 V silicon superjunction MOSFET," Power Semiconductor Devices and ICs, 2002. Proceedings of the 14th International Symposium on , vol., No., pp. 241,244, 2002.
Final Office for U.S. Appl. No. 14/980,770, dated Jul. 13, 2016.
Non-Final Office Action for U.S. Appl. No. 14/738,567, dated Jun. 29, 2016.

* cited by examiner

FIG. 3D
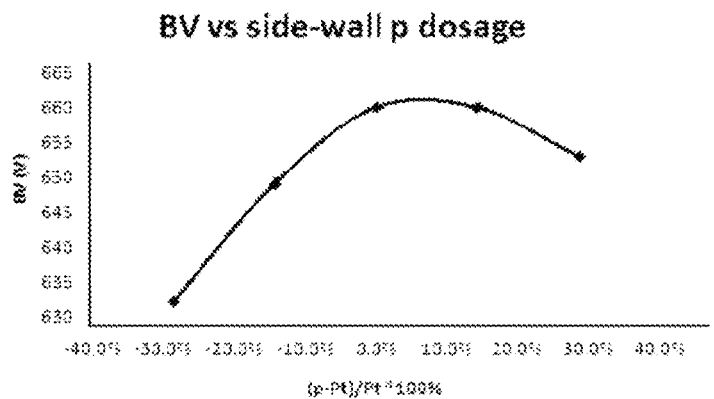
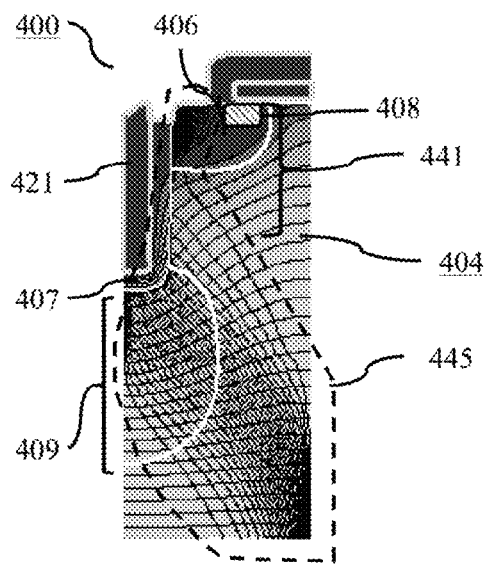
FIG. 4A
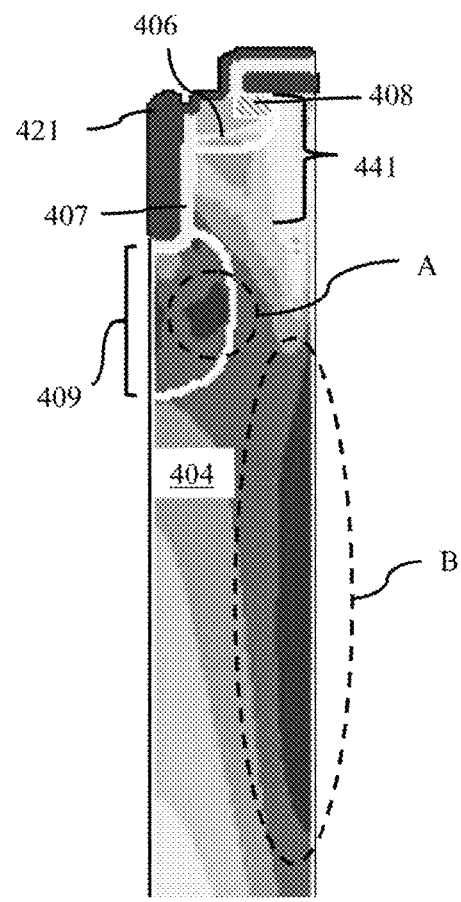
FIG. 4B

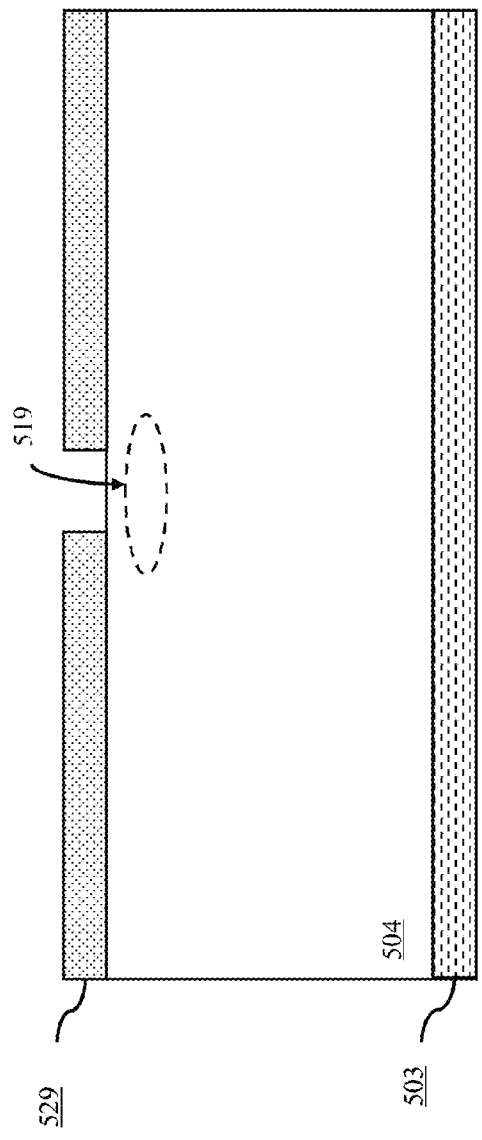
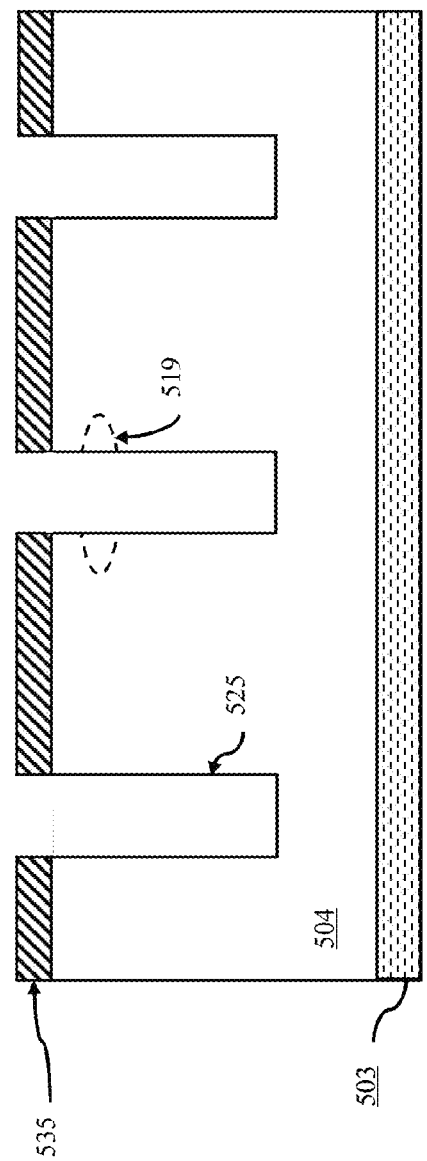
FIG. 5A
FIG. 5B

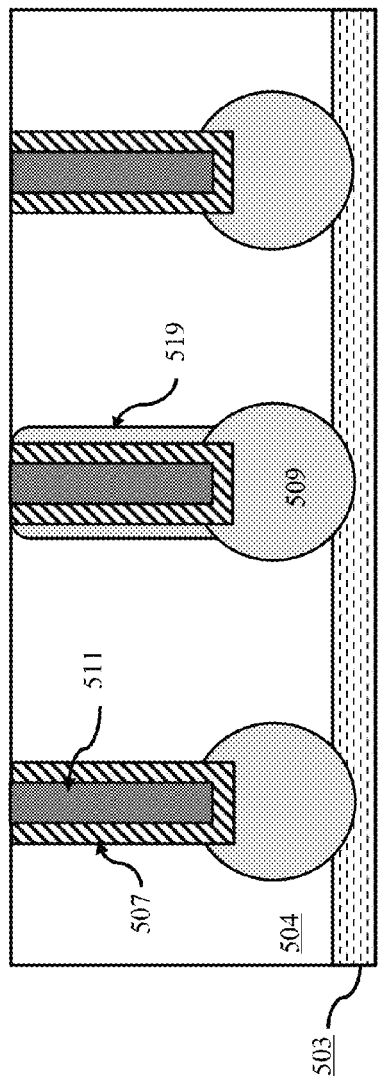
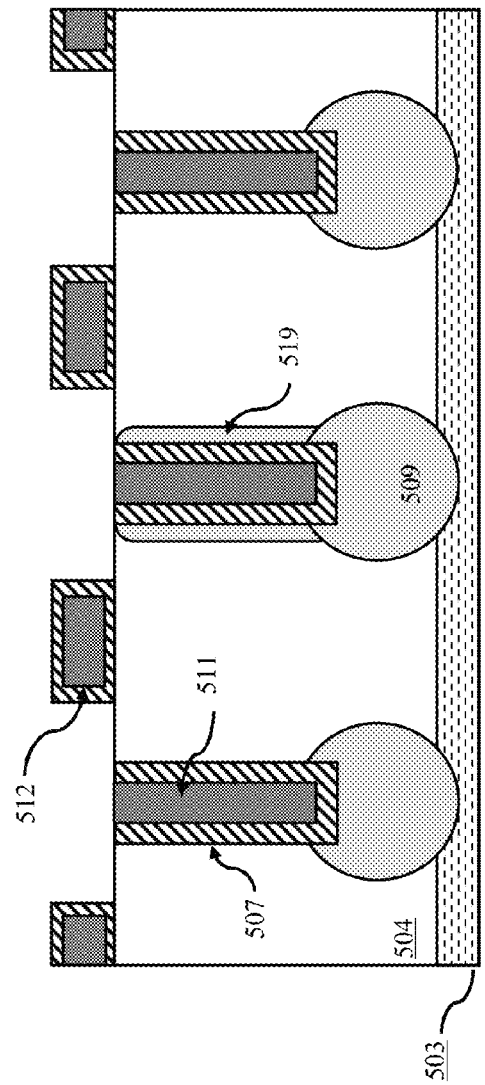
FIG. 5E
FIG. 5F

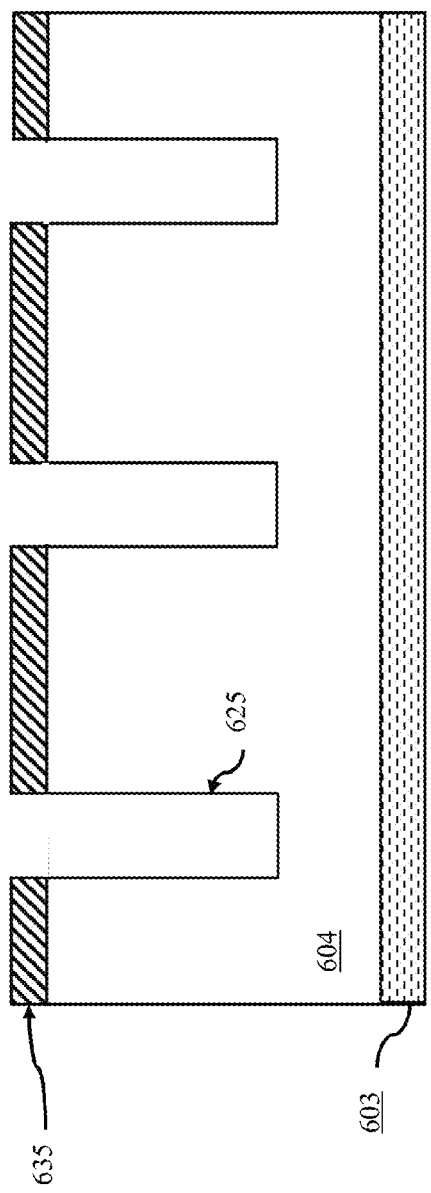
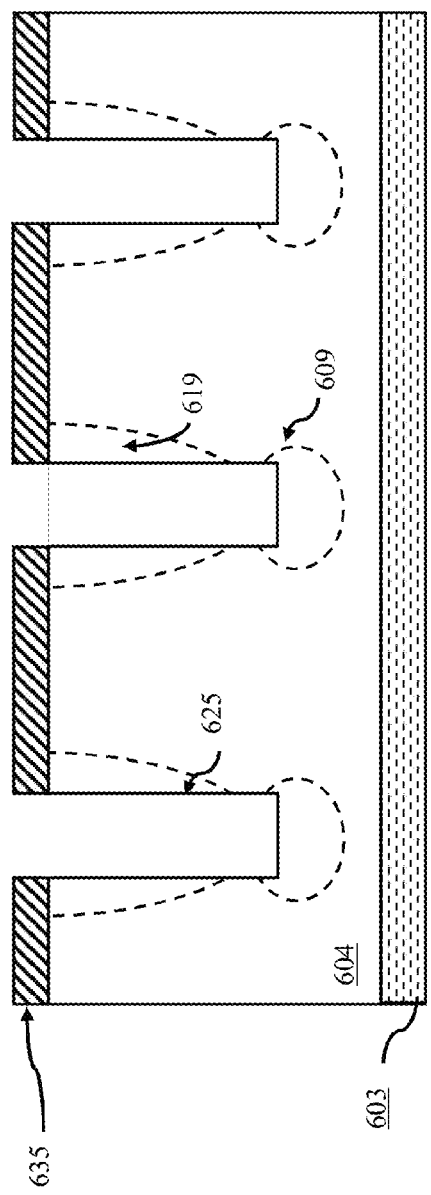

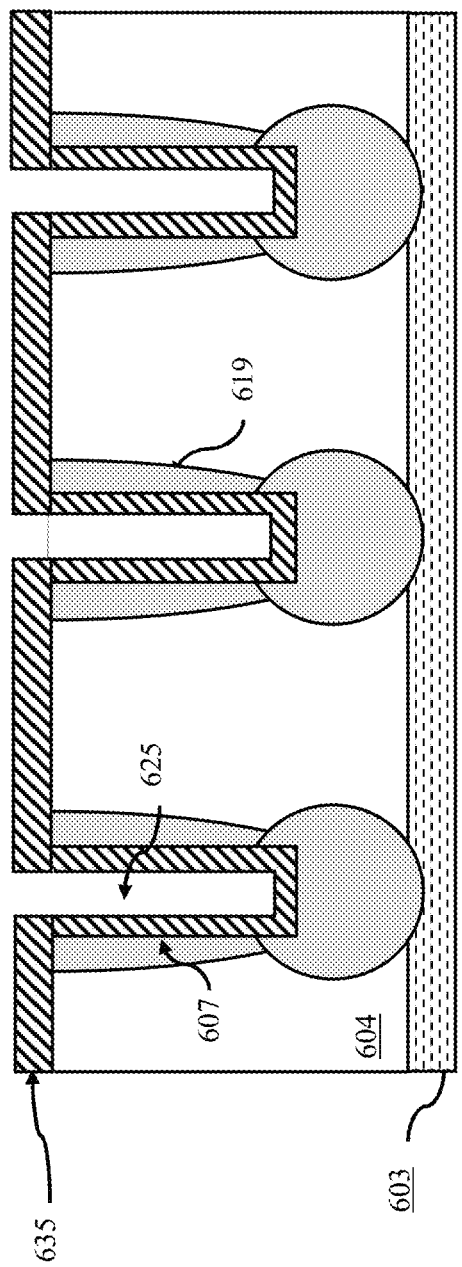
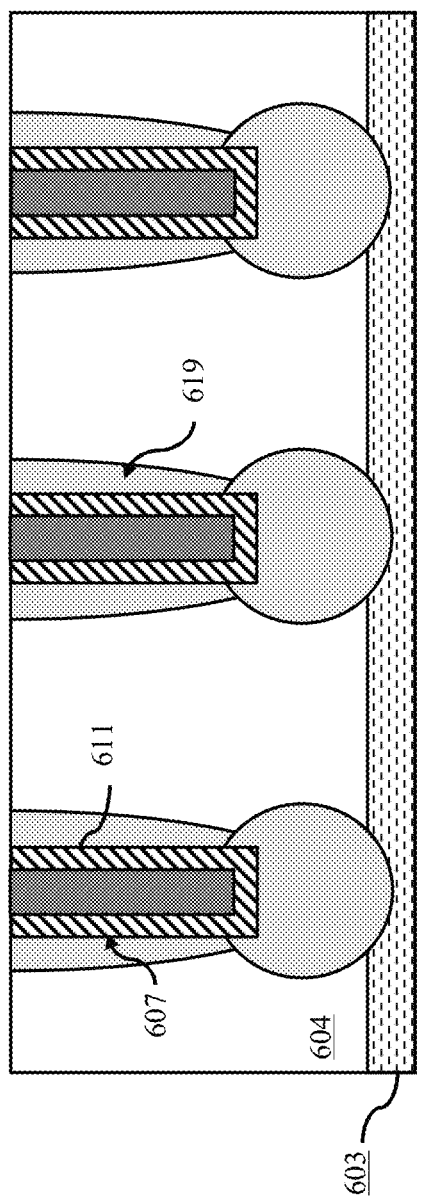
FIG. 6C
FIG. 6D

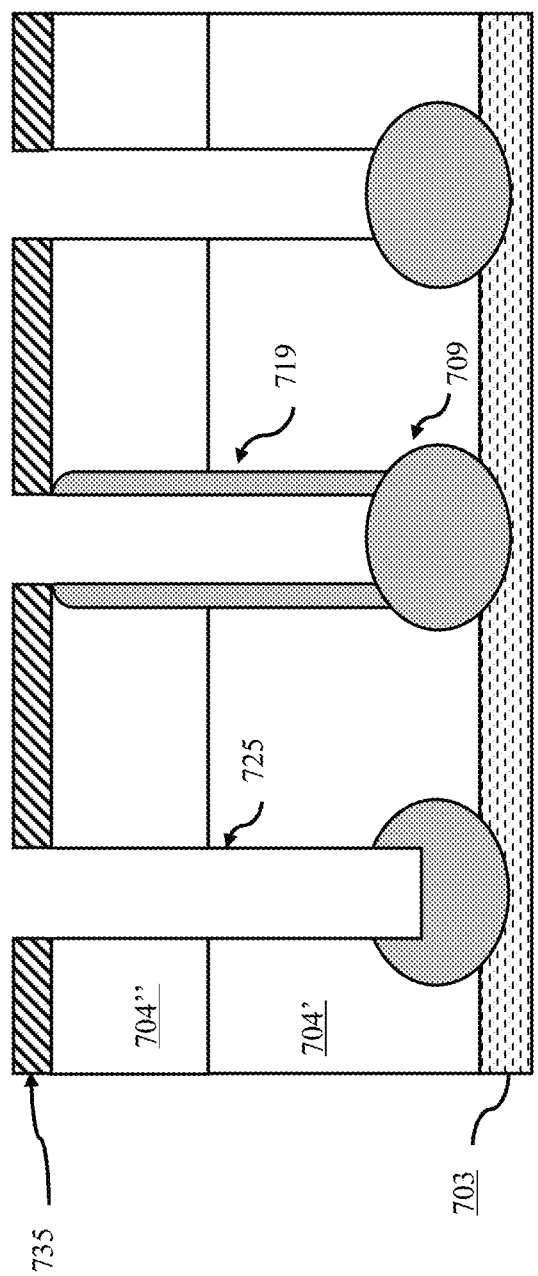

HIGH VOLTAGE FIELD BALANCE METAL OXIDE FIELD EFFECT TRANSISTOR (FBM)

CLAIM OF PRIORITY

This application is a continuation of commonly-assigned, co-pending application Ser. No. 14/329,776, filed Jul. 11, 2014, the entire disclosures of which are incorporated herein by reference. Application Ser. No. 14/329,776 is a divisional of commonly-assigned, co-pending application Ser. No. 13/561,523, filed Jul. 30, 2012 (now U.S. Pat. No. 8,785,279), the entire disclosures of which are incorporated herein by reference.

CROSS-REFERENCE TO RELATED APPLICATION

This application is related to commonly-assigned, co-pending application Ser. No. 13/199,381, filed Oct. 25, 2011, the entire disclosures of which are incorporated herein by reference.

This application is related to commonly-assigned, co-pending application Ser. No. 13/561,300, entitled "TERMINATION DESIGN FOR HIGH VOLTAGE DEVICE" (now U.S. Pat. No. 8,680,613) to Lingpeng Guan et al filed Jul. 30, 2012, the entire disclosures of which are incorporated herein by reference.

This application is related to commonly-assigned, co-pending application Ser. No. 13/561,500, entitled "CORNER LAYOUT FOR HIGH VOLTAGE SEMICONDUCTOR DEVICE" to Lingpeng Guan et al., filed Jul. 30, 2012, the entire disclosures of which are incorporated herein by reference.

FIELD OF THE INVENTION

Embodiments of the present invention are related to semiconductor power devices. More particularly, this invention relates to new configurations and methods for manufacturing improved power device structures with field balance metal oxide field effect transistors (FBMs) for sustaining high breakdown voltage while achieving low drain to source resistance $R_{ds}A$.

BACKGROUND OF THE INVENTION

Conventional technologies to configure and manufacture high voltage semiconductor power devices are still confronted with difficulties and limitations to further improve the performances due to different tradeoffs. In vertical semiconductor power devices, there is a tradeoff between the drain to source resistance, i.e., on-state resistance, commonly represented by $R_{ds}A$ (i.e., drain-source resistance X Active Area) as a performance characteristic, and the breakdown voltage sustainable by the power device. A commonly recognized relationship between the breakdown voltage (BV) and the $R_{ds}A$ is expressed as: $R_{ds}A$ is directly proportional to $BV^{2.5}$. For the purpose of reducing the $R_{ds}A$, an epitaxial layer is formed with a higher dopant concentration. However, a heavily doped epitaxial layer also reduces the breakdown voltage sustainable by the semiconductor power device.

Several device configurations have been explored in order to resolve the difficulties and limitations caused by these performance tradeoffs. An early attempt to improve breakdown voltage was disclosed in U.S. Pat. No. 4,941,026 to Temple. The Temple device uses a deep trench filled with a gate electrode and lined with a thick oxide. This type of structure allows for greater depletion and therefore the doping concentration of the drift region can be increased. With a higher doping concentration, a lower $R_{ds}A$ can be achieved. However, this structure shifts the burden of supporting nearly all of the voltage to the oxide layer that lines the trench. Increasing the thickness of the oxide in order to support more voltage also increases the stress in the device. Therefore, the BV is limited to lower voltage devices such as those rated below 200V.

FIG. 1 shows the cross section of a conventional floating island and thick bottom trench oxide metal oxide semiconductor (FITMOS) field effect transistor (FET) implemented with thick bottom oxide in the trench gate and floating P-dopant islands under the trench gate to improve the electrical field shape. The charge compensation of the P-dopant in the floating islands allows for the N-epitaxial doping concentration to be increased, thus reduce the $R_{ds}A$. In addition, the thick bottom oxide in the trench gate lowers the gate to drain coupling, thus lowering the gate to drain charge $Q_{gd}$. The device further has the advantage of supporting a higher breakdown voltage on both the top epitaxial layer and the lower layer near the floating islands. However, the presence of floating P-region causes higher dynamic on resistance during switching.

In U.S. Pat. No. 7,291,894, Sapp et al. disclose a power transistor that maintains a high BV, while reducing the gate to drain capacitance ($C_{gd}$). In the Sapp transistor $C_{gd}$ is decreased by replacing the trench electrode with an oxide. In order to compensate for the decrease in BV resulting from the removal of the electrode, the walls of the trenches are doped with a P-type dopant before the oxide is formed. This P-doped area provides a charge balancing mechanism that allows for the recovery of some of the BV that was lost by removing the trench electrode, but it is necessary to achieve accurate charge balance to sustain the high breakdown. Similarly, the device described in U.S. Pat. No. 6,762,455 to Oppermann et al also employs a trench filled with oxide. In the Oppermann device the trench sidewall can be doped like that of Sapp, but Oppermann further describes a lower P-doped region being formed below the trench. However, this too suffers from the same limitations as the Sapp device. The absence of an electrode within the trenches places a stringent burden on accurate charge balance to achieve high breakdown.

In U.S. Pat. No. 5,637,898, Baliga discloses a power transistor designed with the specific goal of providing a high breakdown voltage and low on-state resistance. The Baliga power transistor is a vertical field effect transistor in a semiconductor substrate that includes a trench having a bottom in the drift region and an insulated gate electrode for modulating the conductivity of the channel and drift regions in response to the application of a turn-on gate bias. The insulated gate electrode includes an electrically conductive gate in the trench and an insulating region which lines a sidewall of the trench adjacent the channel and drift regions. The insulating region has a non-uniform cross-sectional area between the trench sidewall and the gate. This enhances the forward voltage blocking capability of the transistor by inhibiting the occurrence of high electric field crowding at the bottom of the trench. The thickness of the insulating region is greater along the portion of the sidewall which extends adjacent the drift region and less along the portion of the sidewall which extends adjacent the channel region. The drift region is also non-uniformly doped to have a linearly graded doping profile that decreases in a direction from the drain region to the channel region to provide low on-state resistance. The charge compensation in this device is achieved by the gate electrode. However, the presence of a large gate electrode significantly increases the gate to drain capacitance of this structure, resulting in higher switching losses. In addition, the Baliga device presents the additional manufacturing complexity of having a linearly graded doping profile in the drift region.

In U.S. Pat. No. 7,335,944, Banerjee et al. disclose a type of transistor that includes first and second trenches defining a mesa in a semiconductor substrate. The first and second field plate members are respectively disposed in the first and second trenches, with each of the first and second field plate members separated from the mesa by a thick dielectric layer. The mesa includes a plurality of sections, each section having a substantially constant doping concentration gradient, the gradient of one section being at least 10% greater than the gradient of another section, i.e., the doping profile gradient in the drift region varies as a function of the vertical depth of the drift region. Each field plate is electrically connected to the source electrode. In this device, the charge compensation is achieved by the field plate connected to the source. However, the manufacturing of this structure requires complex fabrication processes that include deep trenches, thick liner oxide, and a doping concentration gradient.

U.S. Pat. No. 7,649,223 to Kawashima discloses a partial superjunction device. Superjunction transistors provide a way to achieve low $R_{ds}A$ while maintaining a high BV. Superjunction devices include alternating P-type and N-type doped columns formed in the drift region. In the OFF-state of the MOSFET, the columns completely deplete at relatively low voltage and thus can sustain a high breakdown voltage. In the Kawashima device, the P-doped columns are formed part way into the depth of an N-doped epitaxial layer in which MOSFET device structures are formed. For a superjunction, the $R_{ds}A$ increases in direct proportion to the BV, which is a much less dramatic increase than in the conventional semiconductor structure. However, superjunction devices require complex processing and many additional masking steps, and therefore are expensive to produce.

For the above reasons, there is a need to provide new device configurations and new manufacturing methods for the semiconductor power devices which reduce the on-state resistance and in the meantime increasing the breakdown voltage sustainable by the power device such that the above discussed difficulties and limitations can be resolved.

BRIEF DESCRIPTION OF THE DRAWINGS

The teachings of the present invention can be readily understood by considering the following detailed description in conjunction with the accompanying drawings, in which:

FIGS. 3A-3D are charts that demonstrate a relationship between different design variables of FBM devices.

FIGS. 4A-4B are cross sectional views of an FBM device according to an embodiment of the present invention and illustrating why the device is less susceptible to high current avalanche mode failures.

FIGS. 5A-5H are a series of cross sectional views for illustrating the manufacturing processes to form the FBM device of FIG. 2A.

FIGS. 6A-6G are a series of cross sectional views for illustrating the manufacturing process to form the FBM device of FIG. 2D.

FIGS. 7A-7D are a series of cross sectional views for illustrating the manufacturing process to form an FBM device according to an embodiment of the present invention.

SUMMARY OF THE INVENTION

Figure 1:
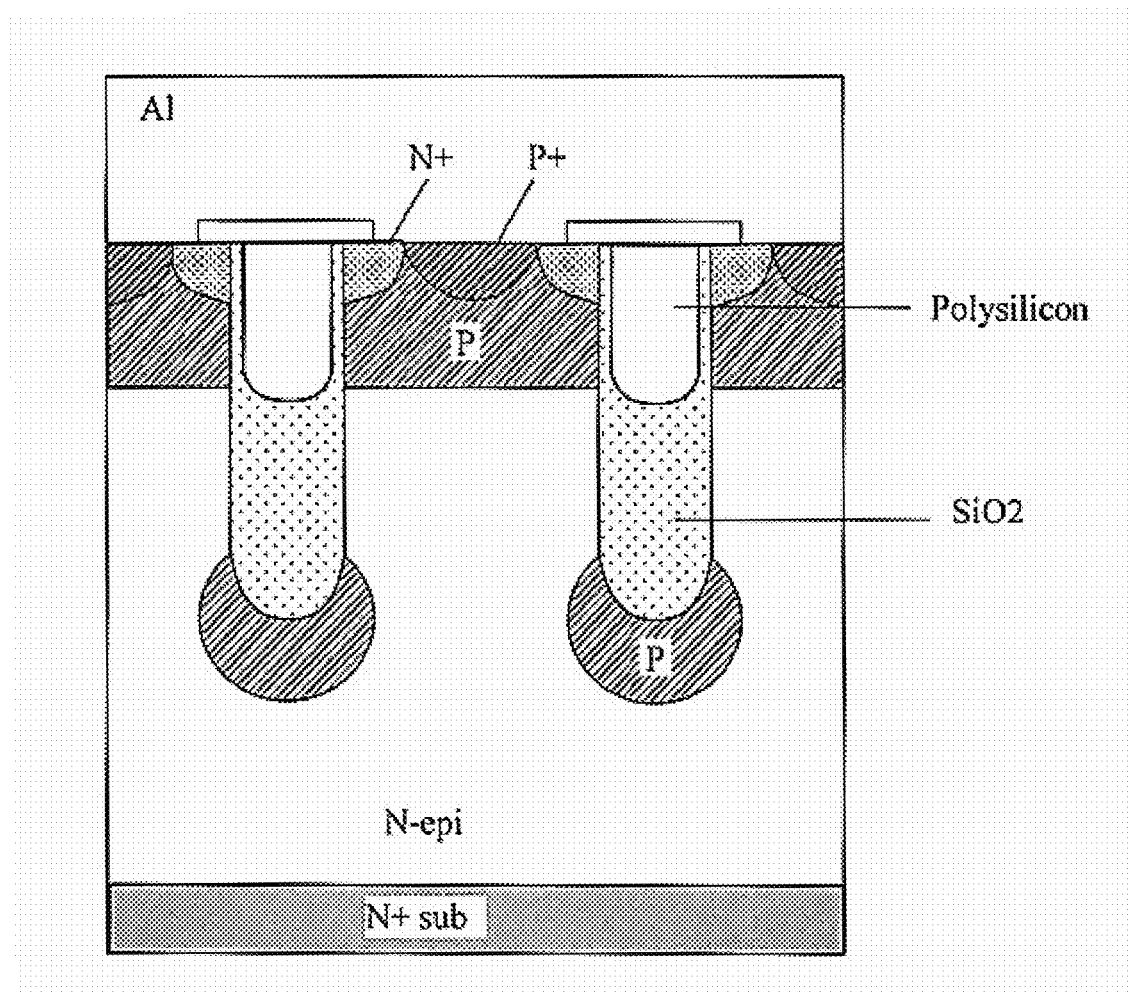
FIG. 1 is a cross-sectional schematic diagram of a prior art field effect transistor device.

The disadvantages associated with the prior art are overcome by embodiments of the present invention relating to a new and improved semiconductor power device configuration and method for manufacturing a semiconductor power device with reduced $R_{ds}A$ and a high sustainable breakdown voltage.

Specifically, it is an aspect of the present invention to provide a new and improved device configuration and manufacturing method for providing a semiconductor power device with reduced $R_{ds}A$ by forming a highly doped epitaxial layer near the top surface of a semiconductor substrate and then forming trenches lined with oxides and filled with conductive material, within the highly doped epitaxial layer. The conductive material within the trenches are connected to a source electrode with buried P-regions formed underneath each source trench to function as charge compensating layers for the highly doped drift region to enable it to sustain high voltage while maintaining low series resistance.

Another aspect of the present invention is to provide a new and improved device configuration and manufacturing method for providing a semiconductor power device that includes a top structure functioning as a MOSFET with a charge compensated drift region and further provided with trenches filled with electrically conductive material (e.g., polysilicon) connected to source electrode and including buried P-regions with some conductive trenches having P-doped regions surround the trench sidewalls to allow for the buried P-regions to discharge.

Another aspect of the present invention is to provide a new and improved device configuration and manufacturing method for manufacturing a semiconductor power device that includes a top structure functioning as a MOSFET with a charge compensated drift region and further provided with trenches filled with electrically conductive material connected to source electrode and including buried P-regions with conductive trenches having P-doped regions surround every trench sidewall.

Briefly, according to a preferred embodiment, a semiconductor power device may be formed in a semiconductor substrate having a highly doped region near a top surface of the semiconductor substrate on top of a lightly doped region supported by a heavily doped region. The semiconductor power device further comprises a source region and a gate region disposed near the top surface of the semiconductor substrate and a drain region disposed at a bottom surface of the semiconductor substrate. The semiconductor power device further comprises source trenches opened into the highly doped region lined with a dielectric and then filled with a conductive trench filling material in electrical contact with the source region near the top surface. The semiconductor power device further comprises buried P-regions disposed at the bottom of the source trenches and doped with dopants of opposite conductivity from the highly doped region.

In a preferred embodiment, the semiconductor power device further comprises doped regions surrounded the sidewalls of the source trenches and doped with a dopant of a same conductivity type of the buried P-regions to allow for the buried P-regions to discharge.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. In the following discussion, a device with an N-type substrate is described for purposes of illustration. Substrates that are P-type may be fabricated using a similar process but with opposite conductivity types. The following detailed description, therefore, is not to be taken in a limiting sense, and the scope of the present invention is defined by the appended claims.

Figure 2A:
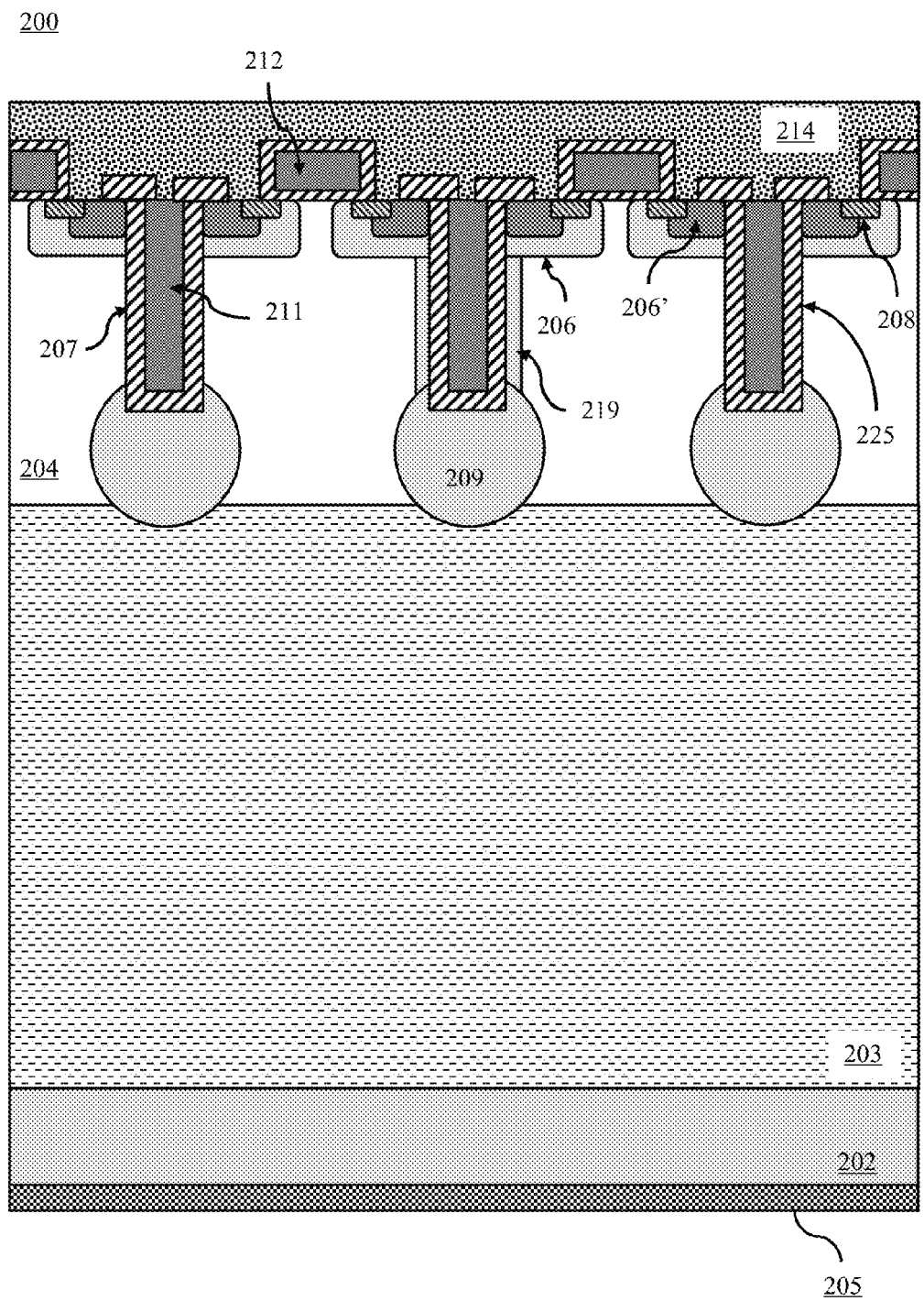
FIG. 2A is a cross sectional view of a field balanced MOSFET (FBM) device according to an embodiment of the present invention.

FIG. 2A is a cross sectional view of a Field Balance MOSFET (FBM) according to an embodiment of the present invention. FBM 200 is formed in a semiconductor substrate having a heavily doped region 202 of a first conductivity type, e.g., an N-type substrate of a concentration of about 2-4e19/cm$^3$. A lightly doped voltage blocking region 203 of the first conductivity type, e.g., N-type, of a concentration of about 1e14/cm$^3$ to 1e15/cm$^3$, is supported on top of the heavily doped region 202. A highly doped surface shielded region 204, which is also of the first conductivity type of a concentration of about 1e15/cm$^3$ to 5e16/cm$^3$, is supported on top of the voltage blocking region 203. By way of example and not by way of limitation, the surface shielded region 204 may have a doping concentration 5-100 times greater than that of the voltage blocking region. The FBM 200 is a vertical device with a drain (or collector) electrode 205 disposed on a bottom surface of the substrate and a source (or emitter) electrode 214 disposed on a top surface. The FBM 200 further includes a plurality of trenches 225 lined with a dielectric layer 207 such as an oxide layer and filled with an electrically conductive trench filling material that forms a shield electrode 211. By way of example, and not by way of limitation, the shield electrode 211 may be made of polysilicon. By way of example and not by way of limitation, the dielectric layer 207 may have a substantially uniform thickness throughout the depth of the trench, it may be somewhat thinner at the bottom of the trench, it may be made thicker at the trench bottom, or it may be tapered higher near the trench bottom. The shield electrode 211 is electrically connected to the source electrode 214. A lightly doped depletable region of the second conductivity type 209, e.g., P-type, is formed at the bottom of the trench 225. The lightly-doped depletable region of the second conductivity type 209 may also be referred to as the buried P-region 209. By way of example and not by way of limitation, the surface shielded region 204 may be shallower than or substantially the same depth as the cumulative depth of the trench 225 plus the buried P-region 209. As used herein, the term "substantially the same depth" means that the depth of the surface shielded region 204 is within ±10% of the cumulative depth of the trench 225 plus the buried P-region 209.

A source region 208 of the first conductivity type is formed near the top surface of the surface shielded region 204. The source region is electrically connected to the source electrode 214. Surrounding the source region 208 is an upper body region 206 of the second conductivity type. Also proximate the source region is a highly doped P$^+$ contact 206'. A planar gate electrode 212 is formed on the top surface covering an area adjacent to the source electrode 214 and the top surface of the source region 208.

Figure 2B:
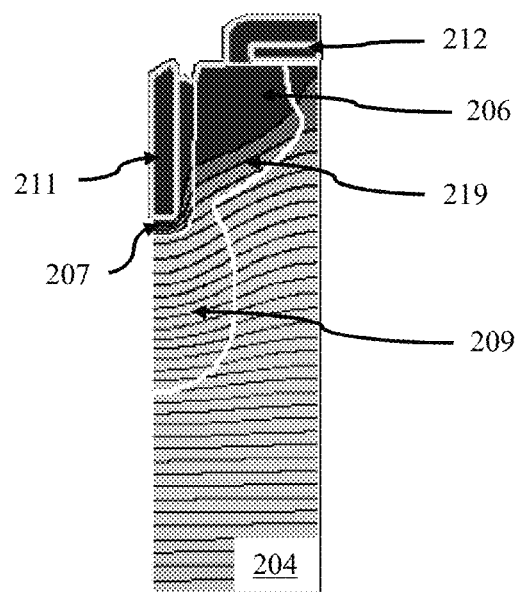
FIG. 2B is a cross sectional view of an FBM device according to an embodiment of the present invention and demonstrates how the P-link functions.

The buried P-region 209 creates a P-N junction capacitor when it is not connected to the body region. This potentially creates problems with switching, because the presence of floating P-regions causes higher dynamic on resistance during switching. Therefore, a suitably doped link 219, e.g., a P-doped link (P-link) for an N-type device 200, may be formed between the buried P-region 209 and the upper body region 206 at selected locations in order to allow an electrical path for the buried P-regions 209 to discharge. FIG. 2A provides an illustration of the P-link 219 between the two regions. The doping concentration of the P-link 219 can be chosen such that the region significantly depletes under reverse bias as shown in FIG. 2B. The equipotential lines shown near the top of the device are at a lower voltage than those at the bottom of the device. Additionally, the darker shading indicates a lower potential. In order for the P-link 219 to significantly deplete, the doping concentration of the P-link 219 can be made lighter than that of the upper body region 206.

Figure 2C:
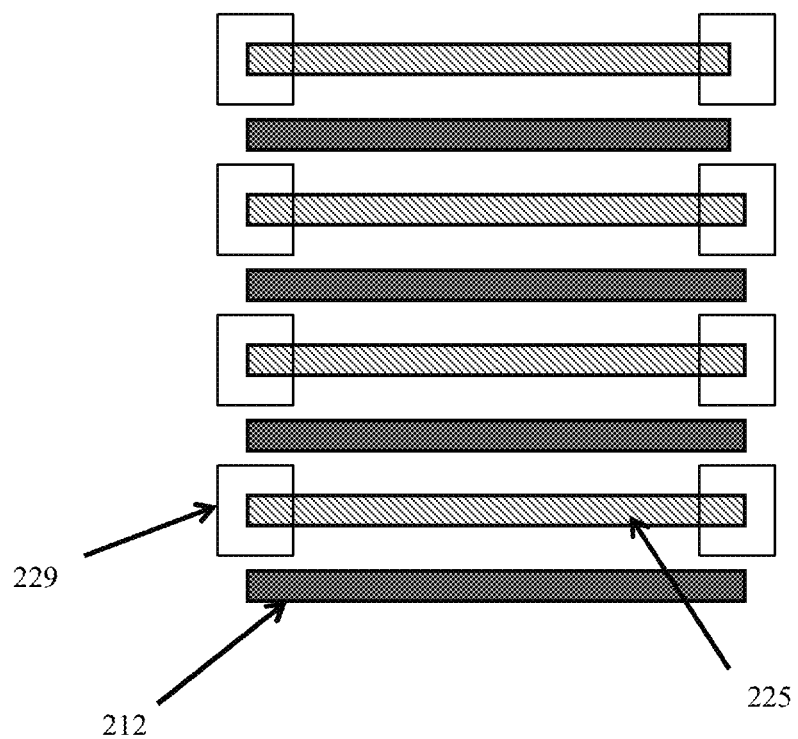
FIG. 2C is an overhead view of an FBM device according to an embodiment of the present invention showing locations where links between the body regions and buried doped regions may be formed.

According to one embodiment the P-links 219 are only made at select locations. Not every trench 225 connects the buried P-region 209 to the upper body region 206 because it would either decrease the BV of the device or worsen its on-resistance. But every buried P-region 209 is connected back the source at some location via the P-link. Additionally, selectively distributing P-links 219 throughout the active area of the device allows for the buried P-region 209 to sufficiently discharge. By way of example and not by way of limitation, FIG. 2C provides a plan view of possible locations for the P-links 219. In this example, the P-links 219 are formed at the end of the device trenches 225 by opening up a small window 229 in a mask layer and allowing a deep diffusion to connect the buried P-region and the upper body region 206.

According to another embodiment of the present invention, in every location the buried P-region 209 is electrically connected to the upper body region 206 with a P-link 219.

Figure 2D:
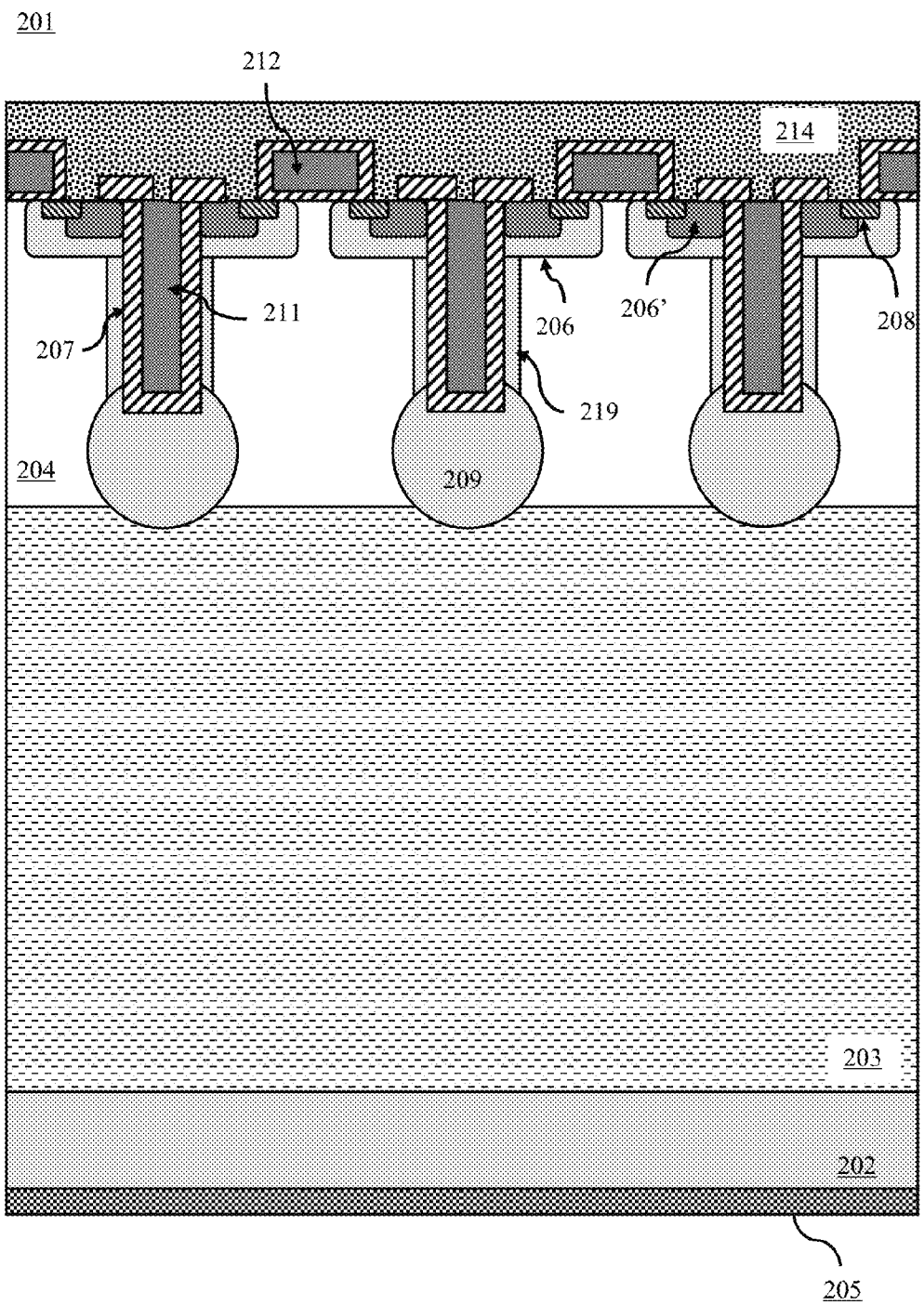
FIGS. 2D-2E are cross sectional views of FBM devices according to two additional embodiments of the present invention.

FIG. 2D is a cross sectional view of an FBM device 201 according to this embodiment. While the BV of the device may be decreased, this embodiment requires one less mask during fabrication. Instead of being forced to open a window in a mask layer for implanting the P-link 219, a blanket angled implant can be used without a mask.

Figure 2E:
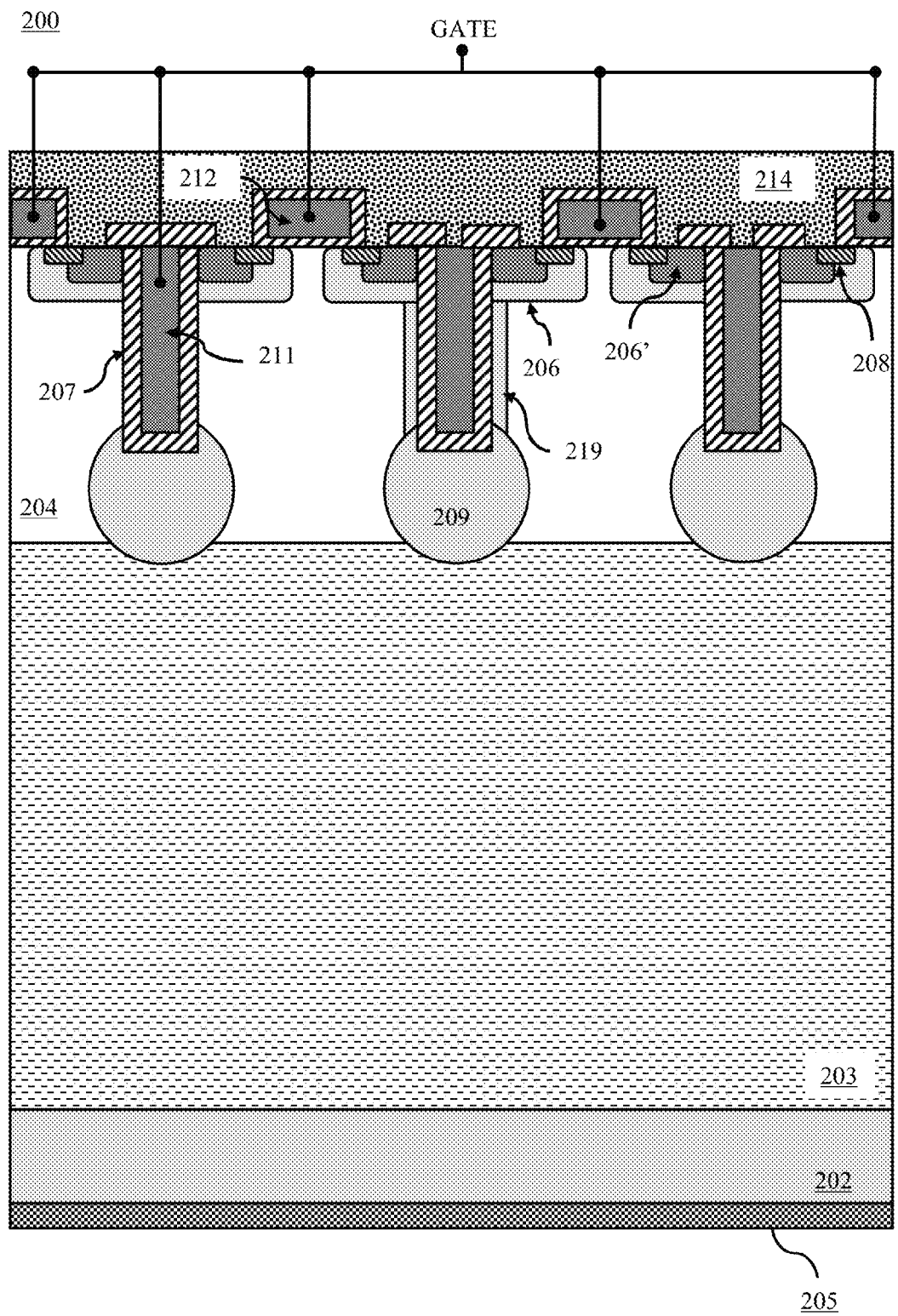

According to yet another embodiment of the present invention, the switching speed of the FBM device may be controlled by connecting the trench filling material 211 in the trench 225 to gate potential instead of the source. FIG. 2E depicts an FBM device 200 that has this connection made in the leftmost trench. This connection will cause an increase in the gate to drain capacitance $C_{gd}$ which will then reduce the switching speed of FBM device 201. By selecting the percentage of trenches 225 that will be connected to the gate instead of the source, the increase in the $C_{gd}$ can be controlled. This is beneficial because at high switching speeds excessive electromagnetic interference (EMI) problems occur.

Embodiments of the present invention maintain a high BV while minimizing $R_{ds}A$. According to embodiments of the present invention, the BV is split between the surface shielded region 204 and the voltage blocking region 203. By way of example and not by way of limitation, an FBM device designed to have a BV of 660 V may have the surface shielded region 204 configured to support 140 V and the voltage blocking region 203 may be configured to support 520 V. The voltage blocking region 203 functions as a traditional epi-layer and follows the relationship of $R_{ds}A \propto BV^{2.5}$. Therefore, the proportional decrease in $R_{ds}A$ of the device as a result of decreasing the voltage supported by the voltage blocking region 203 from 660 V to 520 V is: $(660/520)^{2.5}=1.81$. For example, if the $R_{ds}A$ of a device was originally 82 mΩ-cm² for an epi-layer that must support the entire 660 V, then for a voltage blocking region 203 that only needs to support 520 V, the reduced $R_{ds}A$ would be only 45.2 mΩ-cm².

The surface shielded region 204 is configured to support the remaining voltage, while adding only a negligible amount of resistance. In order to accomplish this, the surface shielded region 204 is highly doped in order to minimize $R_{ds}A$. However, with a high doping concentration, the epitaxial layer alone cannot support enough voltage. Therefore, the surface shielded region 204 needs to be charge compensated. The charge compensation is provided by two separate components: (1) a MOS capacitor created by the oxide 207 surrounding the shield electrode 211; and (2) the buried P-region 209. Both components can be configured such that they each support the desired amount of the voltage. By way of example and not by way of limitation, the voltage supported by the surface shielded region 204 may be half supported by the buried P-region 209 and half supported by the oxide 207.

Figure 3A:
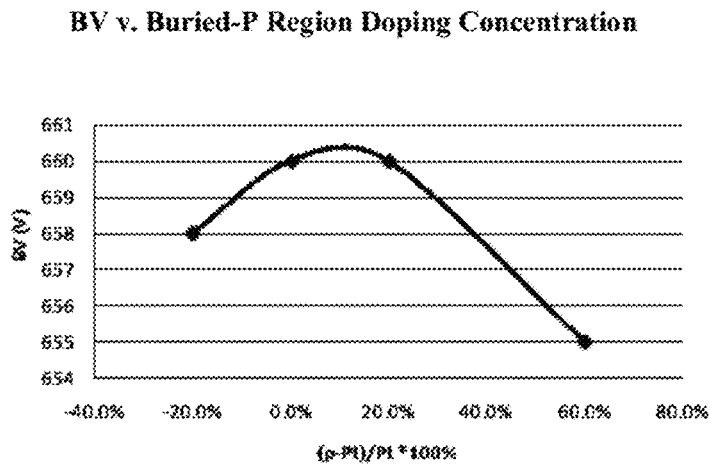

If it is desired that the buried P-region 209 support a larger portion of the voltage, then the buried P-region can be designed to extend deeper into the semiconductor substrate. Variation in the dopant concentration in the buried P-region does not significantly alter the BV of the FBM 200. FIG. 3A shows that a variation of 60% from the targeted concentration only decreases the BV of the device by approximately 5 V. This provides an increase in the robustness of the device, because it allows for greater variation in the processing while still maintaining a high BV. However, variations in the doping concentrations of the P-link 219 may decrease the BV of the FBM 200. As shown in FIG. 3D, a variation of 30% from the targeted concentration can reduce the BV by approximately 30V. It is noted that the sensitivity of the breakdown voltage to the doping concentration is generally not affected by the number of P-links.

Figure 3B:
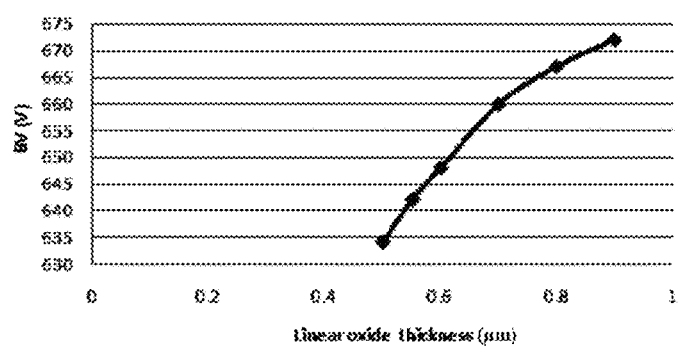
Figure 3C:
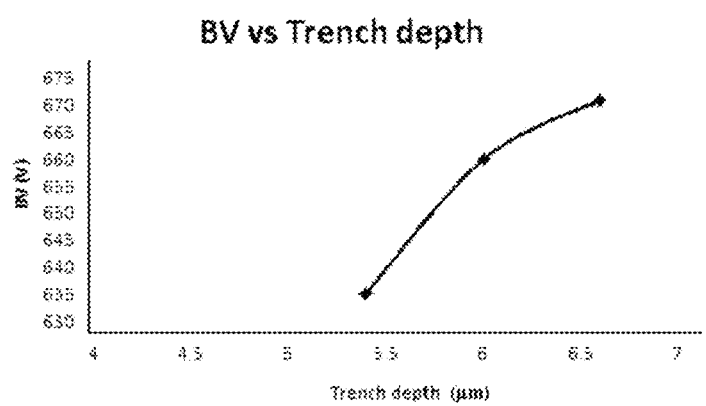

If it is desired that the oxide support more of the voltage, then the depth of the trench 225 may be increased, and/or the thickness of the oxide 207 may be increased. The relationship between oxide thickness and the amount of voltage supported may be described by Equation 1:

$$N(y) = \left[\frac{\varepsilon_{si}}{\frac{qm}{2}\left(\frac{\varepsilon_{si}}{\varepsilon_{ox}}t_{ox}+\frac{m}{2}\right)}\right]\left(\frac{BV}{d-t_{ox}}\right)y \qquad \text{Eq. 1}$$

where N(y) is the doping concentration as a function of depth y, m is the mesa width, $t_{ox}$ is the trench oxide thickness, d is the trench depth, BV is the breakdown voltage, and $\in_{si}$ and $\in_{ox}$ are the permittivities of silicon and oxide respectively. FIG. 3B shows the actual relationship between the thickness of the oxide 207 and the BV of FBM 200, and FIG. 3C shows the actual relationship between the depth of the trench 225 and the BV of FBM 200.

In addition to supporting a portion of the BV, the buried P-region also increases the robustness of the FBM 200. MOSFETs fail in unclamped inductive switching (UIS) mode because a parasitic bipolar NPN transistor (created by the N-source region, the P-body region, and the N-epitaxial layer) turns on and cannot be turned off. The prior art tries to prevent the parasitic NPN transistor 445 from turning on by reducing the resistance or by moving the avalanche region away from the NPN transistor. As shown in FIG. 4A, when the FBM 400 is in the avalanche mode the current 441 flows mostly in the vicinity of the trench sidewall instead of under the source region 408. This prevents the current from flowing near the parasitic bipolar NPN transistor 445, and therefore the device is prevented from latching up. Additionally, the doping concentrations are chosen, such that the location of the highest concentration of electron-hole generation by impact ionization is driven deep into the device. This further improves the robustness of the device, because the temperature of the device increases at locations with a high concentration of impact ionization, and increased temperatures make it is easier for the NPN to switch 445 on. As seen in FIG. 4B the highest regions of impact ionization are in the buried P-region 409 (location A) and deep within the voltage blocking layer (location B). Therefore moving locations A and B far from the parasitic NPN bipolar transistor produces a more robust device.

A key benefit of the present device is the fact that the body diode behavior is far superior during reverse recovery to the behavior seen in conventional charge balance MOSFETs. In charge balance MOSFETs, the depletion of the P-N columns at low voltages leads to the removal of all the stored charge before the device can block a significant voltage. Once the stored charge is gone, the current very quickly drops to zero leading to a "snap" recovery. The high dI/dt (rate of current change) can lead to high voltage overshoots when impressed across circuit stray inductances, and lead to device failure. In the FBM structure, the lower portion of the device stores charge like a conventional power MOSFET, which is not removed until a high blocking voltage is reached. The slower charge removal as the voltage builds up is responsible for a "soft" diode recovery, a feature of great benefit in some power circuits, where it reduces voltage overshoots, minimizes device failure and EMI problems.

Figure 5C:
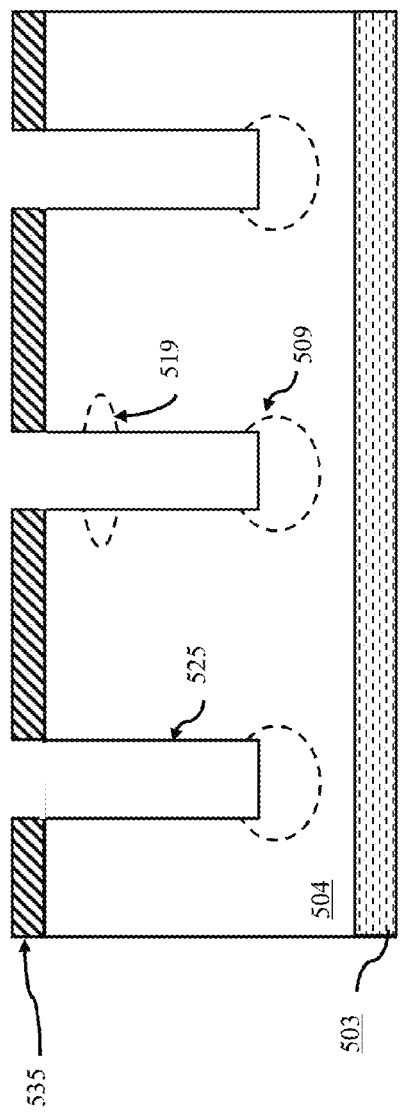

There are a number of different techniques for fabricating FBM devices of the types described above. By way of example, FIGS. 5A-5H are cross-sectional views of the surface shielded region 504 illustrating a method of fabrication of FBM devices of the type depicted in FIG. 2A. This embodiment reduces manufacturing cost since it only requires 7 masks (one mask for each of the following processing steps: (1) the links, (2) trenches, (3) poly gates, (4) source, (5) contacts, (6) metal, and (7) passivation). This is a significant cost savings compared to prior art superjunction devices which typically require as many as 17 masks. As shown in FIG. 5A, a heavily doped N-type epitaxial semiconductor layer 504 is formed above the lightly doped voltage blocking region 503. It should be noted that, for simplicity, only the very top portion of the blocking region 503 is shown in FIGS. 5A-5G. As shown in FIG. 5A, a P-link mask 529 is then formed on a surface of the surface shielded region 504, e.g., by patterning a photoresist layer. P-type dopants are then implanted into the surface shielded region 504 at the locations where a P-link 519 is desired.

Figure 5D:
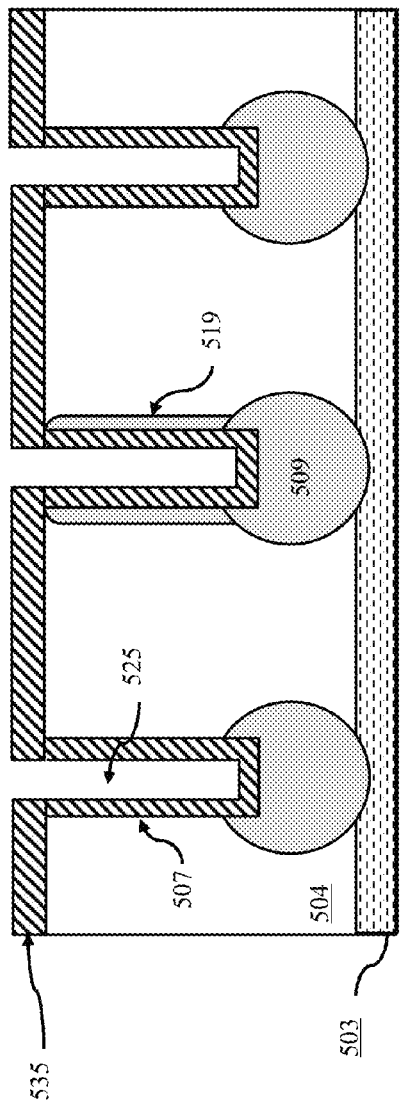

As shown in FIG. 5B, a trench mask 535 is then formed on a surface of the surface shielded region 504, e.g., by patterning a photoresist layer, or by patterning a hardmask oxide formed using a low temperature oxide (LTO) deposition technique or thermal oxidation, and etched with a photoresist mask. A trench 525 is then formed in the highly doped surface shielded region 504 through the trench mask 535 to a predetermined depth. The trench 525 extends through the P-link 519, such that the P-doped regions remain along the sidewalls. By way of example and not by way of limitation the trenches 525 may be formed by reactive ion etching (RIE). As shown in FIG. 5C, the buried P-regions 509 are formed with a blanket vertical P-type dopant implant with a 0° tilt. As shown in FIG. 5D, an oxide layer 507 is grown along the sidewalls and bottom surface of the trenches 525. The P-link 519 and the buried P-region 509 are also allowed to diffuse. This step allows the P-link 519 to connect with the buried P-region 509. The diffusion step and the oxide formation may also be performed at the same time. Additionally, the buried P-regions 509 are diffused such that the combined depth of the trench 525 and the buried P-region 509 are similar to the depth of the surface shielded region 504. By way of example and not by way of limitation, the surface shielded region 504 may be shallower than or substantially the same depth as the cumulative depth of the trench 525 plus the buried P-region 509. As noted above substantially the same depth includes a depth within ±10% of the cumulative depth of the trench 525 plus the buried P-region 509.

Figure 5G:
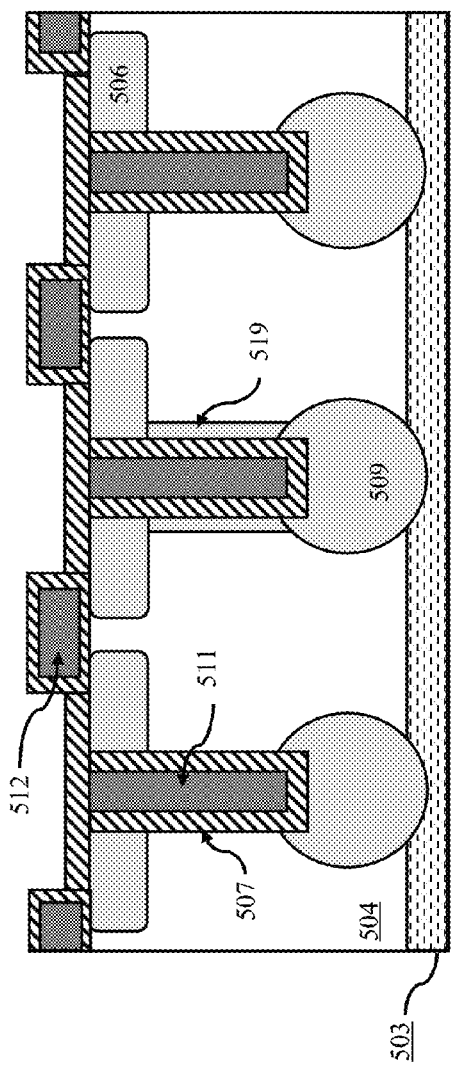
Figure 5H:
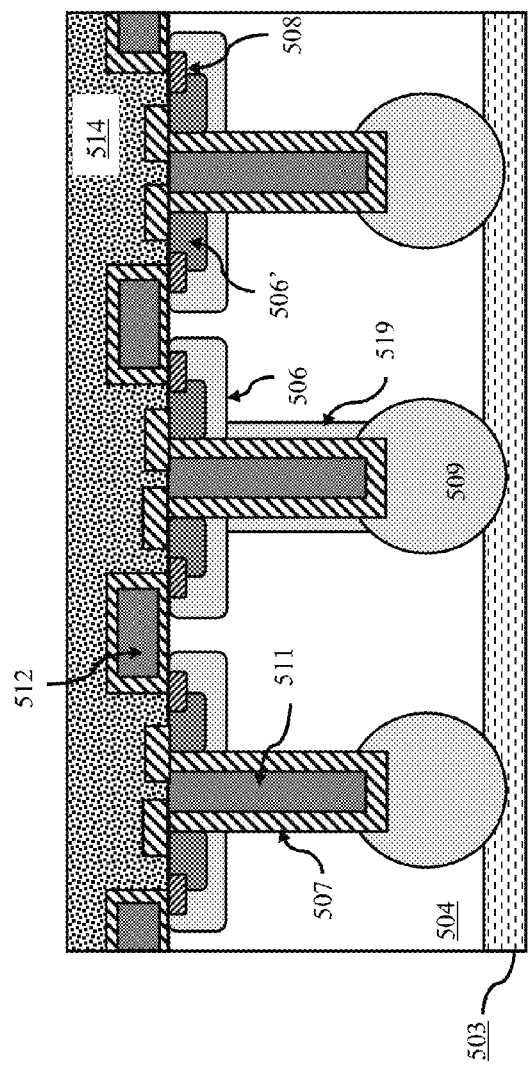

Thereafter, the manufacturing process continues with standard processing steps to form the finished FBM device shown in FIG. 2A. FIG. 5E shows that the trenches are then filled with a trench filling material 511 and the poly and the oxide material are both etched back. FIG. 5F shows the JFET implant, the gate oxidation, and the poly gate 512 definition. FIG. 5G shows the body implant and the drive in. Finally, FIG. 5H shows the finished FBM device 500 after the source masking and implant 508, the source drive in, the self-aligned P+ implant contact 506', the borophosphosilicate glass (BPSG) deposition, contact formation, and metal deposition masking and etching.

According to another embodiment of the present invention, the P-links 519 may be formed with selective side wall implantation. This allows for the initial P-link mask, shown in FIG. 5A to be omitted. However, there is still an additional mask needed for the selective side wall implant and as such, 7 masks are still needed. Before the trench walls are lined with an oxide, selected trenches are masked in order to allow some of the sidewalls to be implanted with a tilted implant.

According to another embodiment of the present invention, the FBM is manufactured such that every buried P-region 209 is connected to the body region 206 with a P-link 219 as shown in FIG. 2D. The advantage of this embodiment is that there is a reduction in the number of mask layers needed for the production of the FBM device. However, this embodiment requires a larger termination region. Since the buried P-region is connected across the entire device, a disconnection must be made in the termination region in order to prevent a short between drain and source. The termination region suitable for this embodiment of the invention is describe in commonly owned U.S. patent application Ser. No. 13/561,300(ANO-054/US), which was incorporated herein by reference above.

Figure 6E:
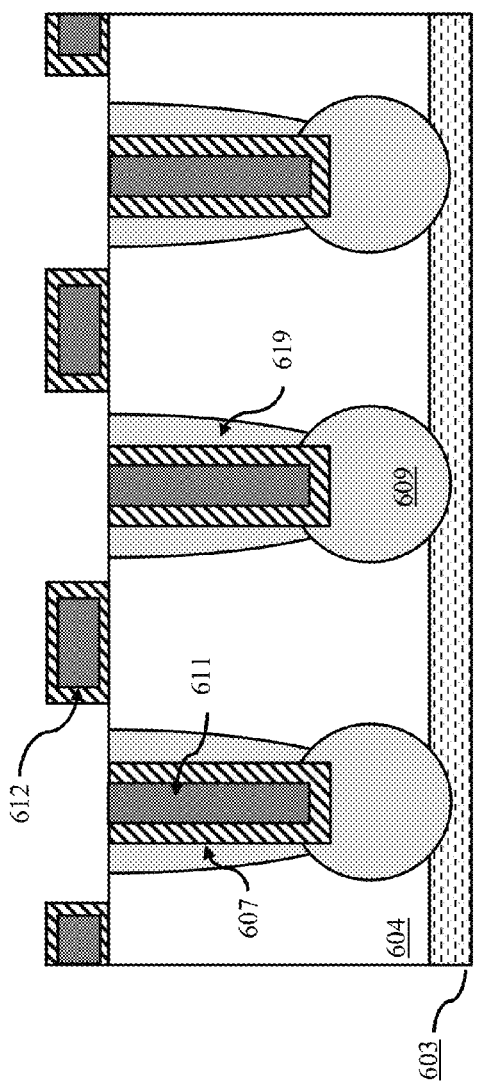

FIGS. 6A-6F illustrate a method of manufacturing according to this embodiment. As shown in FIG. 6A, a trench mask 635 is formed on the surface of the surface shielded region 604, e.g., by patterning a photoresist layer, or by patterning a hardmask oxide formed using a low temperature oxide (LTO) deposition technique or thermal oxidation, etched by a photoresist mask. A trench 625 is then formed in the highly doped surface shielded region 604 to a predetermined depth. By way of example and not by way of limitation, the trenches 625 may be formed by reactive ion etching (RIE). As shown in FIG. 6B, the buried P-regions 609 are formed with a blanket vertical P-type dopant implant with a 0° tilt. Also in FIG. 6B is the sidewall implant used to create the P-link 619. By way of example and not by way of limitation, the side wall implant may be formed with ion implantation at a tilted angle, for e.g. at a 15-30 degree tilt. Alternatively, the sidewall implant may be formed by growing a P-type epitaxial layer along each trench's sidewalls. As shown in FIG. 6C, a layer of insulating material 607, e.g., an oxide layer, is grown along the sidewalls and bottom surface of the trenches 625. The P-links 619 and the buried P-regions 609 are also allowed to diffuse. This step allows the P-links 619 to connect with the buried P-regions 609. The diffusion step and the oxide formation may also be performed at the same time. Additionally, the buried P-regions 609 are diffused such that the combined depth of each trench 625 and the buried P-regions 609 are similar to the depth of the surface shielded region 604. By way of example and not by way of limitation, the surface shielded region 604 may be shallower than or substantially the same depth as the cumulative depth of the trench 625 plus the buried P-region 609. Again, substantially the same depth includes a depth within ±10% of the cumulative depth of the trench 625 plus the buried P-region 609.

Figure 6F:
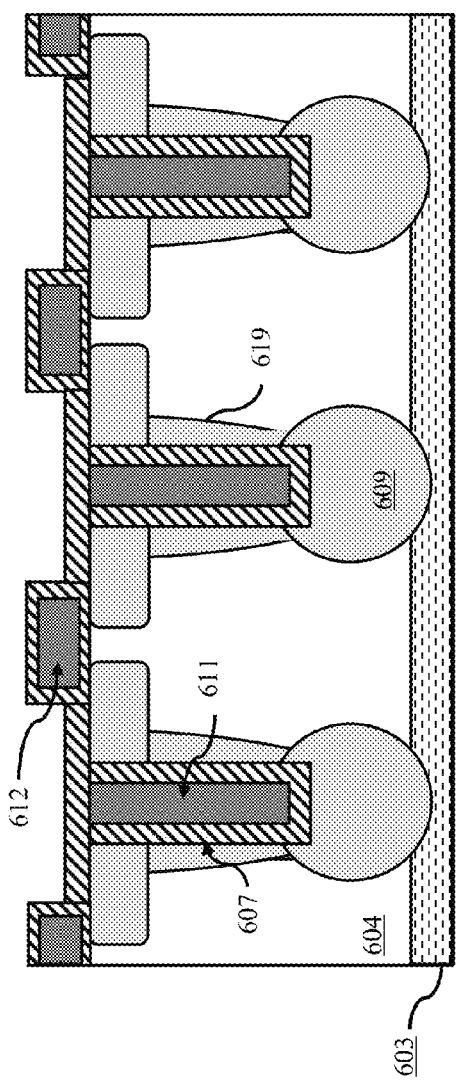
Figure 6G:
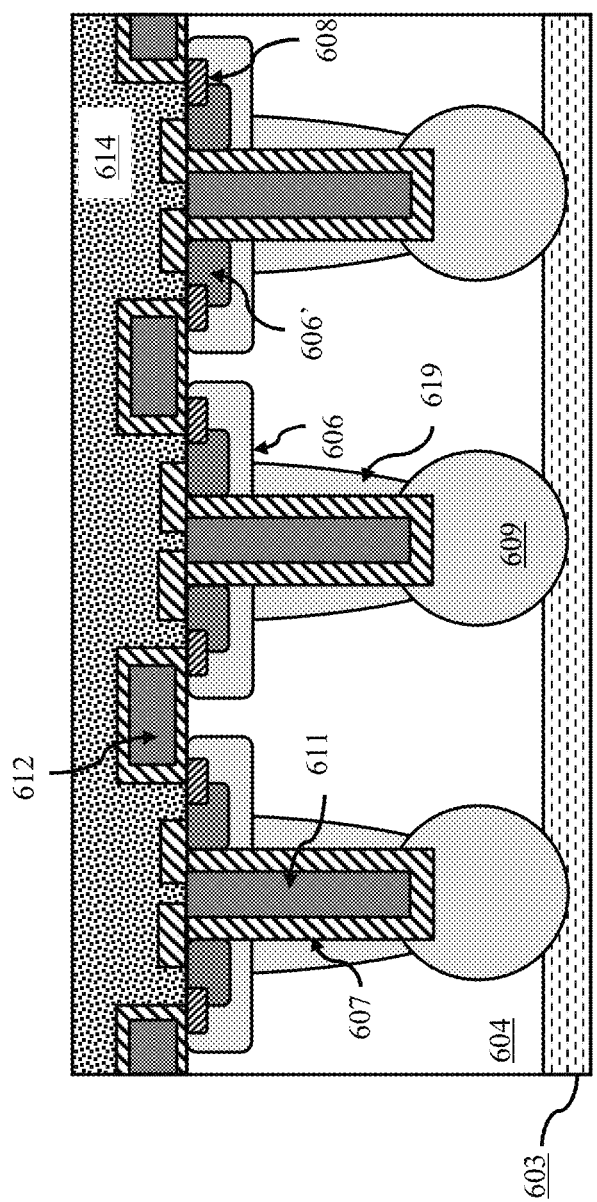

Thereafter, the manufacturing process may proceed with standard processing steps to form the finished FBM device shown in FIG. 2D. Specifically, FIG. 6D shows that the trenches can be filled with an electrically conductive trench filling material 611 (e.g., polyilicon) and the insulating material 607 and trench filling material 611 are both etched back. FIG. 6E shows the JFET implant, the gate oxidation, and the poly gate 612 definition. FIG. 6F shows the body implant and the drive in. Finally, FIG. 6G shows the finished FBM device 600 after the source masking and implant 608, the source drive in, the self-aligned P implant 606', the borophosphosilicate glass (BPSG) deposition, contact formation, and metal deposition masking and etching.

Figure 7A:
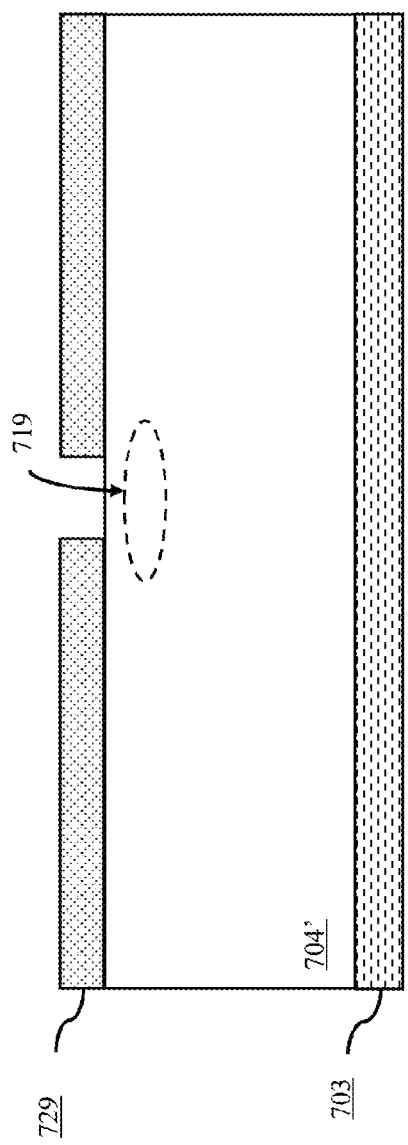
Figure 7B:
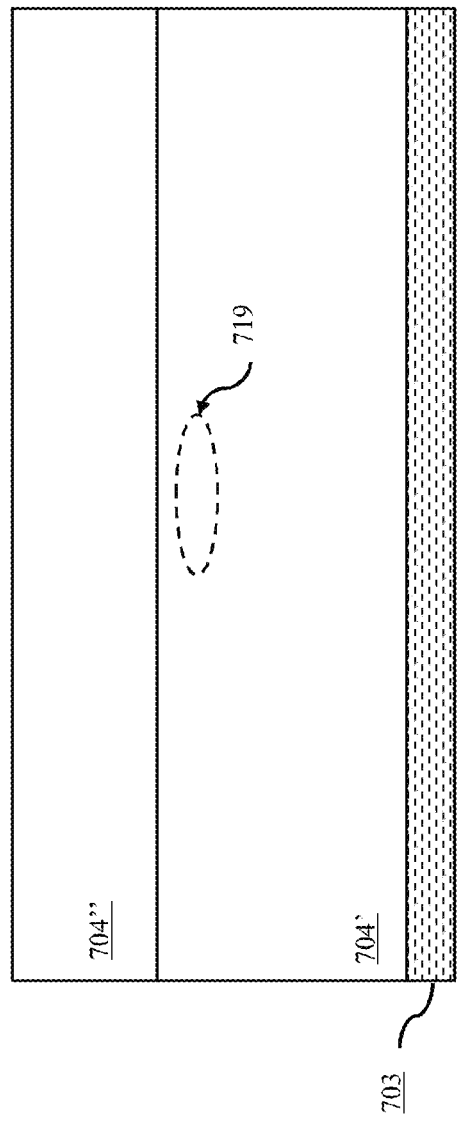

According to another embodiment of the present invention, the P-link 219 may be formed by introducing a separate buried layer about halfway between the body junction and trench bottom, and using diffusion to merge these regions. This method allows for deeper trenches to be formed in the substrate. FIGS. 7A-7D show how this method is used to produce an FBM device 700. First, FIG. 7A shows a partially completed surface shielded region 704' formed above the lightly doped voltage blocking region 703. It should be noted that only the very top portion of the blocking region 703 is shown in FIGS. 7A-7D. A P-link mask 729 is then formed on a surface of the partially completed surface shielded region 704', e.g., by patterning a photoresist layer. P-type dopants are then implanted into the surface shielded region 704' at the locations where a P-link 719 is desired. FIG. 7B then shows the remainder of the surface shielded region 704" being epitaxially grown above the implanted P-link 719.

Figure 7C:
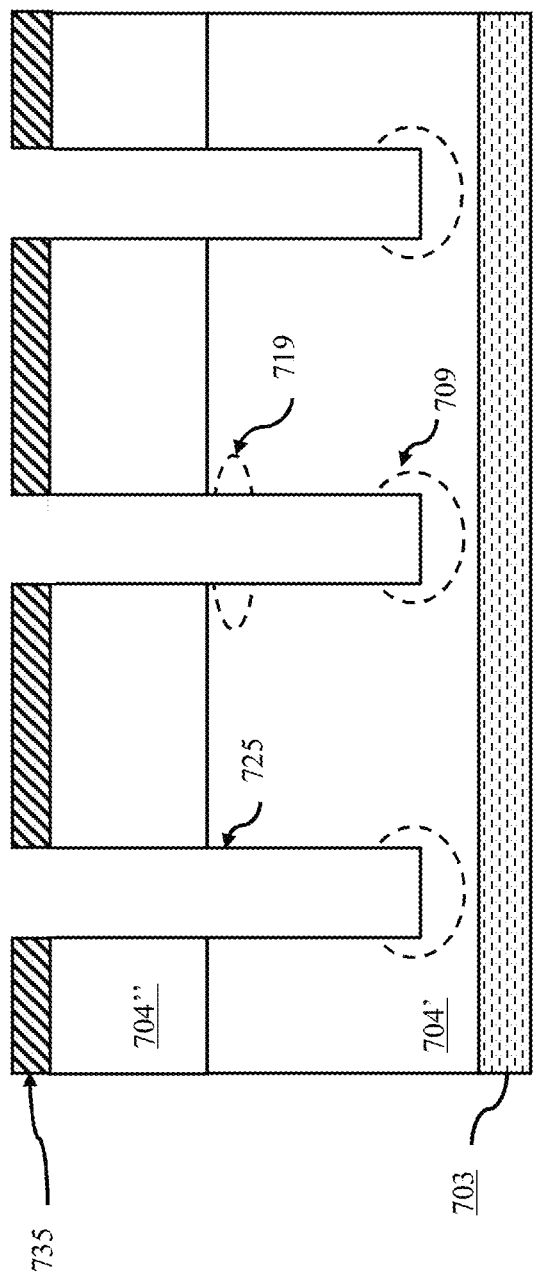

Next, FIG. 7C shows a trench mask 735 formed on a surface of the surface shielded region 704", e.g., by patterning a photoresist layer, or by patterning a hardmask oxide formed using a low temperature oxide (LTO) deposition technique or thermal oxidation, etched by a photoresist mask. A trench 725 is then formed in the highly doped surface shielded region 704' and 704" to a predetermined depth. The trench 725 also extends through the P-link 719, such that the P-doped regions remain along the sidewalls of the trench 725. By way of example and not by way of limitation the trenches 725 may be formed by reactive ion etching (RIE). As shown in FIG. 7C, the buried P-regions 709 are formed with a blanket vertical P-type dopant implant with a 0° tilt. As shown in FIG. 7D, an oxide layer 707 is grown along the sidewalls and bottom surface of the trenches 725. The P-link 719 and the buried P-region 709 are also allowed to diffuse. This allows the P-link 719 to connect with the buried P-region 709. The diffusion step and the oxide formation may also be performed at the same time. Additionally, the buried P-regions 709 are diffused such that the combined depth of the trench 725 and the buried P-region 709 are similar to the depth of the surface shielded region 704. By way of example and not by way of limitation, the surface shielded region 704 may be shallower than or substantially the same depth as the cumulative depth of the trench 725 plus the buried P-region 709. Substantially the same depth includes ±10% the cumulative depth of the trench 725 plus the buried P-region 709. The remaining processing steps are the same as those performed for the previous embodiment and the resulting FBM device 700 is substantially the same as FBM device 500 except that the trenches 725 are deeper. As discussed above, the deeper trenches allow for more voltage to be supported by the surface shielded region 704. Additionally, this embodiment may also be altered to provide a P-link 719 for every buried P-region 709 in the device.

While the above is a complete description of the preferred embodiments of the present invention, it is possible to use various alternatives, modifications, and equivalents. Therefore, the scope of the present invention should be determined not with reference to the above description but should, instead, be determined with reference to the appended claims, along with their full scope of equivalents. The order of recitation of steps in a method is not intended to limit a claim to a particular order of performing the corresponding steps. Any feature, whether preferred or not, may be combined with any other feature, whether preferred or not. In the claims that follow, the indefinite article "A" or "An" refers to a quantity of one or more of the item following the article, except where expressly stated otherwise. The appended claims are not to be interpreted as including means-plus-function limitations, unless such a limitation is explicitly recited in a given claim using the phrase "means for". Any element in a claim that does not explicitly state "means for" performing a specified function, is not to be interpreted as a "means" or "step" clause as specified in 35 USC §112, ¶6.

What is claimed is:

1. A semiconductor device, comprising:
   a semiconductor substrate of a first conductivity type;
   an epitaxial layer of the first conductivity type disposed on a top surface of the semiconductor substrate, wherein the epitaxial layer includes a surface shielded region positioned above a voltage blocking region, the surface shielded region is more heavily doped than the voltage blocking region;
   a body region of a second conductivity type that is opposite of the first conductivity type disposed near a top surface of the surface shielded region, a source region of the first conductivity type disposed near the top surface of the surface shielded region inside the body region, and a drain disposed at a bottom surface of the semiconductor substrate, a gate overlapping a portion of the source region and a portion of the body region having a gate insulation layer separating the gate from the source region and the body region;
   first and second trenches formed in the surface shielded region, wherein the first and second trenches are lined with a trench insulation material and filled with an electrically conductive trench filling material;
   a first buried doped region of the second conductivity type positioned below the first trench, a second buried doped region of the second conductivity type positioned below the second trench, and wherein the first and second buried doped regions extend to a depth substantially the same as a depth of a bottom surface of the surface shielded region.

2. The device of claim 1, wherein the electrically conductive trench filling material in the first trench is configured to be in electrical contact with a source electrode on top of the surface shielded region and in electrical contact with the source region.

3. The device of claim 1, wherein the electrically conductive trench filling material in the second trench is configured to be in electrical contact with the gate.

4. The device of claim 1, wherein the first and second buried doped regions are configured to electrically connect to the body region.

5. The device of claim 1, further comprising a charge linking path of the second conductivity type positioned along one or more trench walls of the first trench and configured to electrically connect the first buried doped region to the body region.

6. The device of claim 5, wherein the charge linking path is formed by diffusion.

7. The device of claim 5, wherein the first and second trenches are formed in parallel stripes, wherein the charge linking path is located at end portions of the first and second trenches.

8. The device of claim 1, wherein the gate is formed on the top surface of the surface shielded region.

9. The device of claim 1, wherein the first and second trenches extend through the body region.

10. The device of claim 1, wherein the first and second buried doped regions are lighter doped than the body region.

11. A semiconductor device, comprising:
    a semiconductor substrate of a first conductivity type;
    an epitaxial layer of the first conductivity type disposed on a top surface of the semiconductor substrate, wherein the epitaxial layer includes a surface shielded region positioned above a voltage blocking region, the surface shielded region is more heavily doped than the voltage blocking region;

a body region of a second conductivity type that is opposite of the first conductivity type disposed near a top surface of the surface shielded region, a source region of the first conductivity type disposed near the top surface of the surface shielded region inside the body region, and a drain disposed at a bottom surface of the semiconductor substrate, a gate overlapping a portion of the source region and a portion of the body region having a gate insulation layer separating the gate from the source region and the body region;

first and second trenches formed in the surface shielded region, wherein the first and second trenches are lined with a trench insulation material and filled with an electrically conductive trench filling material;

a first buried doped region of the second conductivity type positioned below the first trench, a second buried doped region of the second conductivity type positioned below the second trench, wherein the first and second buried doped regions are electrically connected to the body region, and wherein portions of the surface shielded region extend along trench walls of the first and second trenches separating the first and second buried doped regions from the body region.

12. The device of claim 11, wherein the electrically conductive trench filling material in the first trench is configured to be in electrical contact with a source electrode on top of the surface shielded region and in electrical contact with the source region.

13. The device of claim 11, wherein the electrically conductive trench filling material in the second trench is configured to be in electrical contact with the gate.

14. The device of claim 11, further comprising charge linking paths of the second conductivity type positioned along one or more trench walls of the first and second trenches and configured to electrically connect the first and second buried doped regions to the body region.

15. The device of claim 14, wherein the charge linking path are formed by diffusion.

16. The device of claim 14, wherein the first and second trenches are formed in parallel stripes, and wherein the charge linking paths are located at end portions of the first and second trenches.

17. The device of claim 11, wherein the first and second buried doped regions extend to a depth substantially the same as a depth of a bottom surface of the surface shielded region.

18. The device of claim 11, wherein the first and second buried doped regions extend to a depth shallower than a depth of a bottom surface of the surface shielded region.

19. The device of claim 11, wherein the gate is formed on the top surface of the surface shielded region.

20. The device of claim 11, wherein the first and second trenches extend through the body region.

21. The device of claim 11, wherein the first and second buried doped regions are lighter doped than the body region.

* * * * *